United States Patent
Kim

(10) Patent No.: US 7,081,977 B2
(45) Date of Patent: Jul. 25, 2006

(54) ANGULAR MULTIPLEXING APPARATUS FOR HOLOGRAPHIC STORAGE MEDIUM

(75) Inventor: Kun Yul Kim, Seoul (KR)

(73) Assignee: Daewoo Electronics Corporation, Seoul (KR)

( * ) Notice: Subject to any disclaimer, the term of this patent is extended or adjusted under 35 U.S.C. 154(b) by 241 days.

(21) Appl. No.: 10/847,396

(22) Filed: May 18, 2004

(65) Prior Publication Data

US 2005/0088713 A1    Apr. 28, 2005

(30) Foreign Application Priority Data

Oct. 22, 2003    (KR)    ........................ 10-2003-0073731

(51) Int. Cl.
*G03H 1/10*    (2006.01)
(52) U.S. Cl. ............................ 359/10; 359/11; 359/32; 369/103
(58) Field of Classification Search .................. 359/10, 359/11, 22, 32, 33, 3, 4; 369/102, 103
See application file for complete search history.

(56) References Cited

U.S. PATENT DOCUMENTS

| 4,636,027 | A | | 1/1987 | Dube |
| 5,436,867 | A | | 7/1995 | Mok |
| 5,550,779 | A | * | 8/1996 | Burr et al. .................... 365/216 |
| 5,859,808 | A | * | 1/1999 | Campbell et al. ............ 365/216 |
| 5,973,806 | A | * | 10/1999 | Campbell et al. .............. 359/15 |
| 6,061,154 | A | | 5/2000 | Campbell et al. |
| 6,097,513 | A | | 8/2000 | Noh |
| 2004/0090899 | A1 | * | 5/2004 | Gladney et al. ............ 369/103 |

FOREIGN PATENT DOCUMENTS

| JP | 57053719 | 3/1982 |
| JP | 10206885 | 8/1998 |
| KR | 10-1999-007455 | 1/1999 |
| KR | 10-2000-0001990 | 1/2000 |
| WO | 95/12149 | 5/1995 |

* cited by examiner

*Primary Examiner*—Fayez G. Assaf
(74) *Attorney, Agent, or Firm*—Bacon & Thomas

(57) ABSTRACT

An angular multiplexing apparatus for a holographic storage medium. The angular multiplexing apparatus includes a reconstructing reference beam generator, translated in parallel to a number of positions, for generating a number of reconstructing reference beams which propagate in parallel to one another at the positions, respectively, and a mirror array having a plurality of planes of reflection for generating a plurality of reflected beams which are converged into a reconstructing position of the holographic storage medium.

13 Claims, 4 Drawing Sheets

US 7,081,977 B2

ANGULAR MULTIPLEXING APPARATUS FOR HOLOGRAPHIC STORAGE MEDIUM

FIELD OF THE INVENTION

The present invention relates to an angular multiplexing apparatus for a holographic storage medium; and, more particularly, to an angular multiplexing apparatus for a holographic storage medium for use in a holographic Rom system using a reconstructing reference beam including a plane reference beam and a spherical reference beam.

BACKGROUND OF THE INVENTION

An angular multiplexing apparatus for a holographic storage medium is, traditionally, classified into one using a plane reference beam as shown in FIG. 1A and the other using a spherical reference beam as shown in FIG. 1B according to a reconstructing reference beam used therein.

FIG. 1A shows a holographic Rom system including a conventional angular multiplexing apparatus for a holographic storage medium using the plane reference beam. The plane reference beam provided from a laser 1 propagates along a path S1; is reflected sequentially by a first and a second mirror 2, 4; is transmitted sequentially through a first and a second lens 5, 6; and is projected onto a reconstructing position P of a holographic storage medium 8. Subsequently, the plane reference beam is diffracted by a holographic interference pattern in the holographic storage medium 8 to generate a reconstructed beam, which is detected by a detector 9.

The first and the second lens 5, 6 serve to substantialize angular multiplexing in the holographic storage medium 8 using the plane reference beam. Specifically, when focal lengths f of the first and the second lens 5, 6 are equal to each other, the second mirror 4, the first and the second lens 5, 6 and the holographic storage medium 8 are disposed such that a distance from the second mirror 4 to the first lens 5, a distance from the first lens 5 to the second lens 6, and a distance from the second lens 6 to the reconstructing position P of the holographic storage medium 8 are f, 2f, and f, respectively. As shown with dashed lines in FIG. 1A, it is possible to implement the angular multiplexing in the holographic storage medium 8 since a rotation of the second mirror 4 causes an angle of reflection of the plane reference beam on the second mirror 4 to be varied so that an incidence angle of the plane reference beam onto the holographic storage medium 8 after being transmitted through the first and the second lens 5, 6 is varied.

However, the angular multiplexing apparatus shown in FIG. 1A is only for the plane reference beam and, therefore, it has been difficult to form a focus at the reconstructing position P of the holographic storage medium 8 when a spherical reference beam is used instead of the plane reference beam.

FIG. 1B illustrates a holographic Rom system including another conventional angular multiplexing apparatus for the holographic storage medium using the spherical reference beam. After a plane reference beam provided from a laser 11 is reflected by a first mirror 12, the plane reference beam is transmitted through a lens 13-1 to be converted into the spherical reference beam. The spherical reference beam propagates along a path S2; is reflected by a second mirror 14-1; and is projected onto a reconstructing position P of a holographic storage medium 18. Subsequently, the spherical reference beam is diffracted by a holographic interference pattern in the holographic storage medium 18 to generate a reconstructed beam, which is detected by a detector 19.

The lens 13-1 and the second mirror 14-1 serve to substantialize angular multiplexing in the holographic storage medium 18 using the spherical reference beam. Specifically, in order to change an incidence angle of the spherical reference beam onto the reconstructing position P of the holographic storage medium 18, the lens 13-1 must be moved along the path S2 of the spherical reference beam and the second mirror 14-1 must be rotated to have a predetermined inclination angle as well as be moved along the propagation path S2 of the spherical reference beam. In other words, in order to change the incidence angle of the spherical reference beam onto the holographic storage medium 18, as shown with dashed lines in FIG. 1B, the mirror 14-1 must be changed into a mirror 14-2 or 14-3 with the inclination angle thereof to be rotated and the location thereof to be moved. Further, in order to form a focus of the spherical reference beam precisely at the reconstructing position P of the holographic storage medium 18, as shown with dashed lines in FIG. 1B, the lens 13-1 must be moved to form a lens 13-2 or 13-3 such that a path distance from the lens 13-1, 13-2 or 13-3, i.e., a generating position of the spherical reference beam, to the reconstructing position P of the holographic storage medium 18 is equal to a focal length of the spherical reference beam. Therefore, three degrees of freedom such as a translation of the lens 13-1, a translation and a rotation of the mirror 14-1 must be controlled connectively to substantialize the angular multiplexing when the spherical reference beam is used.

SUMMARY OF THE INVENTION

It is, therefore, an object of the present invention to provide an angular multiplexing apparatus for a holographic storage medium capable of substantializing the angular multiplexing in a holographic storage medium using a reconstructing reference beam including a plane reference beam and a spherical reference beam by only moving a reconstructing reference beam generator.

In accordance with a preferred embodiment of the present invention, there is provided an angular multiplexing apparatus for a holographic storage medium, comprising:

a reconstructing reference beam generator, translated by a translating unit to a number of positions, for generating a number of reconstructing reference beams which propagate in parallel through said number of positions, respectively; and a mirror array having a plurality of planes of reflection for generating a plurality of reflected beams which are converged into a reconstructing position of the holographic storage medium with a plurality of incidence angles, respectively, wherein each reconstructing reference beam is reflected by a plane of reflection to be a reflected beam.

In accordance with another preferred embodiment of the present invention, there is provided an angular multiplexing apparatus for a holographic storage medium, comprising:

a reconstructing reference beam generator, translated by a translating unit to a number of positions, for generating a reconstructing reference beam which propagates through one of the number of positions; and a mirror array having a plurality of planes of reflection for reflecting the reconstructing reference beam by one of the plurality of planes of reflections to generate a reflected beam to be converged into a reconstructing position of the holographic storage medium with an incidence angle, wherein a path of the reconstructing reference beam is substantially perpendicular to a translation direction of the reconstructing reference beam generator and the reconstructing reference beam generator is translated by the translating unit to another position to generate another reconstructing reference beam, which is reflected by another plane of reflection to generate another reflected beam to be converged into the reconstructing position of the holographic storage medium with another incidence angle.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Figure 1A:
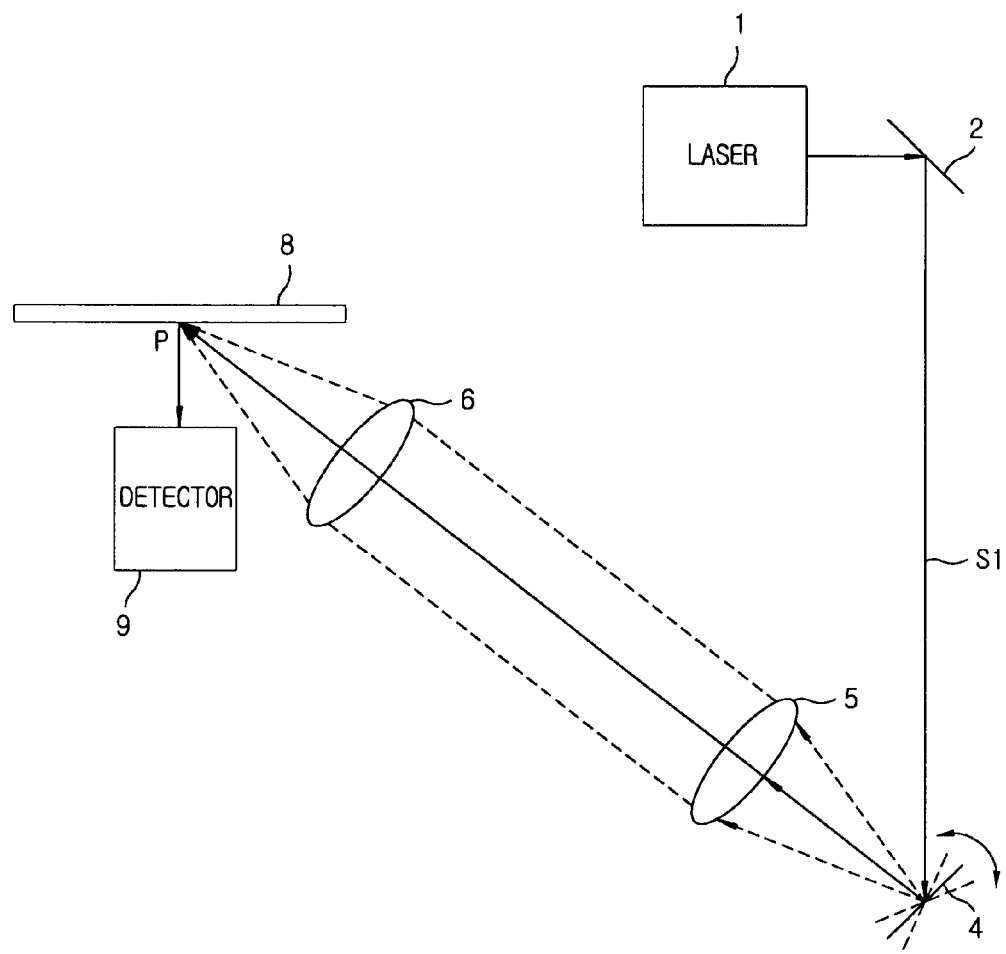
FIG. 1A shows a holographic Rom system including a conventional angular multiplexing apparatus for a holographic storage medium using a plane reference beam.
Figure 1B:
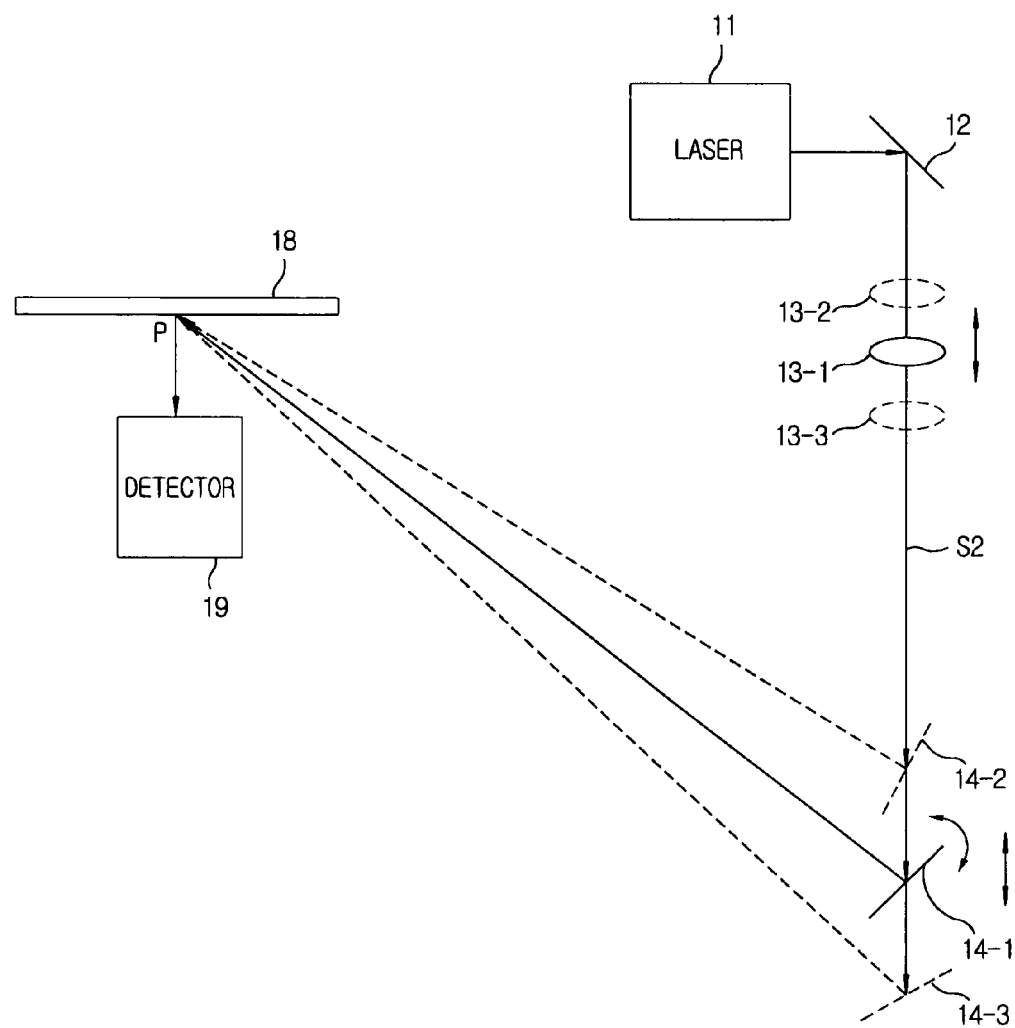
FIG. 1B illustrates a holographic Rom system including a conventional angular multiplexing apparatus for a holographic storage medium using a spherical reference beam.
Figure 2:
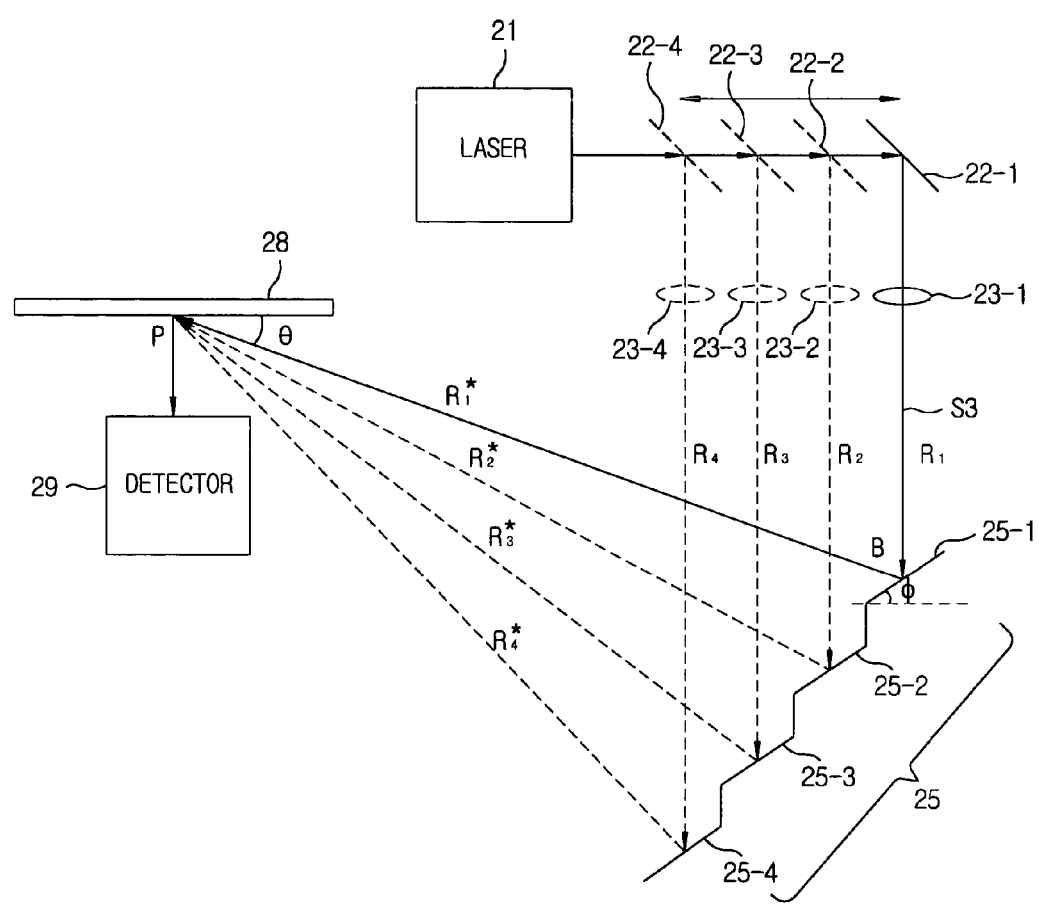
FIG. 2 depicts a holographic Rom system including an angular multiplexing apparatus for a holographic storage medium in accordance with the present invention.

FIG. 2 depicts a holographic Rom system including an angular multiplexing apparatus for a holographic storage medium in accordance with the present invention, wherein the holographic Rom system includes a laser 21, a mirror 22-1, a lens 23-1, a mirror array 25, a holographic storage medium 28, and a detector 29. The laser 21 is, e.g., a semiconductor laser, and generates a reconstructing reference beam of a plane wave. In order that the reconstructing reference beam is diffracted by a holographic interference pattern stored in the holographic storage medium 28 to generate a reconstructed beam, a wavelength of the reconstructing reference beam must be equal to that of a reference beam used in forming the holographic interference pattern based on a holographic interference principle. The reconstructing reference beam is reflected by the mirror 22-1 and then propagates toward the lens 23-1. The lens 23-1 serves to convert the plane wave into a spherical wave and, thus, converts the reconstructing reference beam of the plane wave into a spherical reference beam, i.e., the reconstructing reference beam of the spherical wave. A set of the mirror 22-1 and the lens 23-1 in accordance with the present invention are attached to a stage (not shown) which is translated in parallel along a translation direction. As the stage is translated in parallel to a first to a fourth position, a first to a fourth spherical reference beam $R_1$, $R_2$, $R_3$, $R_4$ are generated. Therefore, the first to the fourth spherical reference beam $R_1$, $R_2$, $R_3$, $R_4$ are parallel to one another. It is preferable that paths of the first to the fourth spherical reference beams $R_1$, $R_2$, $R_3$, $R_4$ and the translation direction (an arrow direction) of the set of the mirror 22-1 and the lens 23-1 are perpendicular to each other in accordance with the present invention. Referring to FIG. 2, there are shown three sets of mirrors 22-2, 22-3, 22-4 and their corresponding lenses 23-2, 23-3, 23-4 at three positions with dashed lines, respectively, which may result from a parallel translation of the set of the mirror 22-1 and the lens 23-1.

The spherical reference beam propagates toward the mirror array 25 along a path S3. The mirror array 25 in accordance with the present invention is a terraced mirror having a number of planes of reflection 25-1, 25-2, 25-3, 25-4. For example, the first spherical reference beam $R_1$, which is generated by converting a plane reference beam by the set of the mirror 22-1 and the lens 23-1 at the first position, is reflected by a first plane of reflection 25-1 of the mirror array 25 to generate a first reflected beam $R_1^*$. On the other hand, when the set of the mirror 22-1 and the lens 23-1 at the first position is translated in parallel to be the set of the mirror 22-2 and the lens 23-2 at the second position, the second spherical reference beam $R_2$ is reflected by a second plane of reflection 25-2 of the mirror array 25 to generate a second reflected beam $R_2^*$. In the same manner, a third reflected beam $R_3^*$ and a fourth reflected beam $R_4^*$ are generated corresponding to the set of the mirror 22-3 and the lens 23-3 at the third position and the set of the mirror 22-4 and the lens 23-4 at the fourth position, respectively. In order to substantialize the angular multiplexing of hologram in the holographic storage medium 28 in accordance with the present invention, inclination angles $\phi$ of the first to the fourth plane of reflection 25-1, 25-2, 25-3, 25-4 must vary from one another such that the first to the fourth reflected beam $R_1^*$, $R_2^*$, $R_3^*$, $R_4^*$ may be converged into a reconstructing position P of the holographic storage medium 28.

Figure 3:
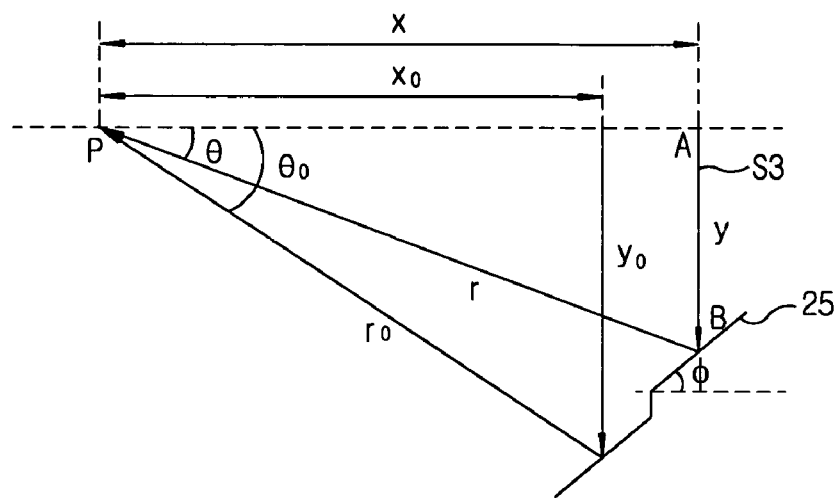
FIGS. 3 and 4 present mathematical models for manufacturing a mirror array shown in FIG. 2.
Figure 4:
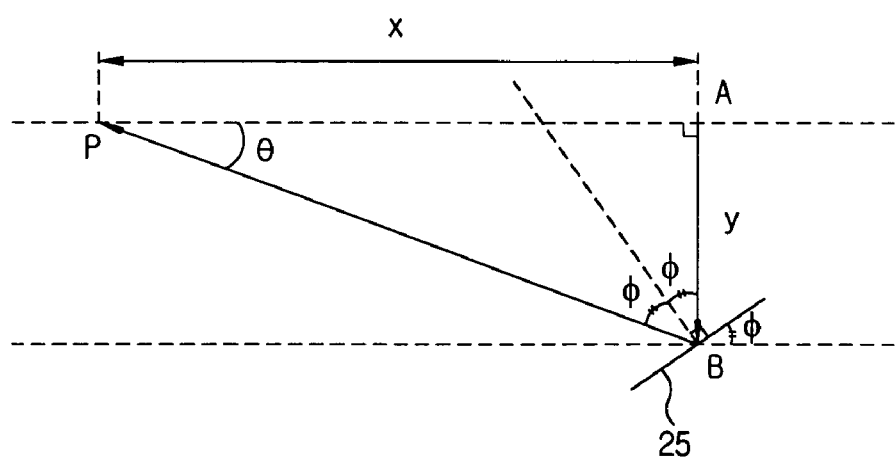

FIGS. 3 and 4 present mathematical models for manufacturing the mirror array 25 including a number of planes of reflection such as the first to the fourth planes of reflection 25-1, 25-2, 25-3, 25-4 in accordance with the present invention. In order that a number of spherical reference beams are converged into the reconstructing position P of the holographic storage medium in accordance with an angular multiplexing principle of the holographic storage medium, lengths of paths from a number of positions where the spherical reference beams are generated to the reconstructing position P of the holographic storage medium must be equal. For convenience in explaining, as shown in FIG. 2, it is assumed that the holographic storage medium 28 maintains horizontality; all the first to the fourth spherical reference beam $R_1$, $R_2$, $R_3$, $R_4$ which are parallel to one another are projected vertically and downward by the sets of the mirrors 22-1, 22-2, 22-3, 22-4 and their corresponding lenses 23-1, 23-2, 23-3, 23-4 at the first to the fourth position, respectively; and all the first to the fourth reflected beam $R_1^*, R_2^*, R_3^*, R_4^*$, which are generated by reflecting the first to the fourth spherical reference beam $R_1, R_2, R_3, R_4$ are reflected by the first to the fourth plane of reflection 25-1, 25-2, 25-3, 25-4, respectively, are converged into the reconstructing position P of the holographic storage medium 28. In such case, a perpendicular distance x from the reconstructing position P of the holographic storage medium 28 to a spherical reference beam, a distance y from an intersecting point A between a horizontal line passing though the reconstructing position P and the spherical reference beam to a reflecting point B of one plane of reflection in the first to the fourth plane of reflection 25-1, 25-2, 25-3, 25-4 of the mirror array 25, and inclination angles φ of the first to the fourth plane of reflection 25-1, 25-2, 25-3, 25-4 which are inclined relative to the horizontal line, respectively, are calculated as follows:

$$y + r = c, \qquad y > 0, r > 0, c > 0,$$

$$x = r\cos\theta = \frac{c\cos\theta}{1+\sin\theta}, \quad y = r\sin\theta = \frac{c\sin\theta}{1+\sin\theta},$$

$$\varphi = \frac{\frac{\pi}{2} - \theta}{2}$$

wherein θ is an incidence angle of the reflected beams $R_1^*, R_2^*, R_3^*, R_4^*$ onto the reconstructing position P, i.e., an angle between the reflected beams $R_1^*, R_2^*, R_3^*, R_4^*$ and the horizontal line, and a constant c is a sum of a distance from the intersecting point A to the reflecting point B and a distance from the reflecting point B to the reconstructing position P.

A focus of the lens 23-1 must be formed at the reconstructing position P of the holographic storage medium 28 to substantialize angular multiplexing in the holographic storage medium 28. Accordingly, when a position of the lens 23-1 is identical to the intersecting point A, the spherical reference beam is generated from the intersecting point A, and the constant c is equivalent to a focal length of the lens 23-1. When the lens 23-1 is located a specified separation distance away from the intersecting point A, the constant c is equivalent to a value obtained by subtracting the specified separation distance from the focal length of the lens 23-1. On the contrary, when the lens 23-1 is located close to the mirror array 25 by a specified separation distance from the intersecting point A, the constant c is equivalent to a value obtained by adding the specified separation distance to the focal length of the lens 23-1.

The mirror 22-1 and the lens 23-1 are formed as one set in one embodiment of the present invention, but it is not limited thereto. In FIG. 2, when the mirror 22-1 is removed and a laser (not shown) generating a reconstructing reference beam of a plane wave vertically and downward is installed in place of the mirror 22-1, the laser and the lens 23-1 may be formed as one set and translated in parallel in a horizontal direction. Further, angular multiplexing in a holographic storage medium using a spherical reference beam is only explained in one embodiment of the present invention, but the present invention is not limited thereto.

For example, angular multiplexing in a holographic storage medium using a plane reference beam may be implemented by removing the lens 23-1.

As has been described above, in case of reconstructing a holographic storage medium by using the reconstructing reference beam including the plane reference beam and the spherical reference beam, the mirror array in accordance with the present invention can be used to implement the angular multiplexing in the holographic storage medium using the reconstructing reference beam by translating in parallel the set of the mirror and the lens.

While the invention has been shown and described with respect to the preferred embodiments, it will be understood by those skilled in the art that various changes and modifications may be without departing from the spirit and scope of the invention as defined in the following claims.

What is claimed is:

1. An angular multiplexing apparatus for a holographic storage medium, comprising:
   a reconstructing reference beam generator, translated by a translating unit to a number of positions, for generating a number of reconstructing reference beams which propagate in parallel through said number of positions, respectively; and
   a mirror array having a plurality of planes of reflection for generating a plurality of reflected beams which are converged into a reconstructing position of the holographic storage medium at a plurality of incidence angles, respectively, wherein each reconstructing reference beam is reflected by a plane of reflection to be a reflected beam.

2. The angular multiplexing apparatus of claim 1, wherein the reconstructing reference beam generator includes a unit for converting a plane reference beam into a spherical reference beam, which is used to generate said number of reconstructing reference beams, so that each reconstructing reference beam corresponds to the spherical reference beam.

3. The angular multiplexing apparatus of claim 2, wherein the converting unit is a lens.

4. The angular multiplexing apparatus of claim 3, wherein a total path of the spherical reference beam and the reflected beam from the lens to the reconstructing position is substantially equivalent to a focal length of the lens.

5. The angular multiplexing apparatus of claim 4, wherein a perpendicular distance x from the reconstructing position to the spherical reference beam, a distance y from an intersecting point between a line passing though the reconstructing position and the spherical reference beam to a reflecting point of the plane of reflection in the mirror array from which the reflected beam corresponding to the spherical reference beam is generated, and an inclination angle φ of the plane of reflection to the line are calculated as:

$$y + r = c, \qquad y > 0, r > 0, c > 0,$$

$$x = r\cos\theta = \frac{c\cos\theta}{1+\sin\theta}, \quad y = r\sin\theta = \frac{c\sin\theta}{1+\sin\theta},$$

$$\varphi = \frac{\frac{\pi}{2} - \theta}{2}$$

wherein θ is an incidence angle of the reflected beam onto the reconstructing position and a constant c is a sum of a distance from the intersecting point to the reflecting point and a distance from the reflecting point and the reconstructing position.

6. The angular multiplexing apparatus of claim 5, wherein the constant c is the focal length of the lens when the lens is located at the intersecting point.

7. The angular multiplexing apparatus of claim 1, wherein paths of said number of reconstructing reference beams are substantially perpendicular to a translation direction along which the reconstructing reference beam generator is translated.

8. An angular multiplexing apparatus for a holographic storage medium, comprising:
a reconstructing reference beam generator, translated by a translating unit to a number of positions, for generating a reconstructing reference beam which propagates through one of the number of positions; and
a mirror array having a plurality of planes of reflection for reflecting the reconstructing reference beam by one of the plurality of planes of reflections to generate a reflected beam to be converged into a reconstructing position of the holographic storage medium at an incidence angle,
wherein a path of the reconstructing reference beam is substantially perpendicular to a translation direction of the reconstructing reference beam generator and the reconstructing reference beam generator is translated by the translating unit to another position to generate another reconstructing reference beam, which is reflected by another plane of reflection to generate another reflected beam to be converged into the reconstructing position of the holographic storage medium at another incidence angle.

9. The angular multiplexing apparatus of claim 8, wherein the reconstructing reference beam generator includes a unit for converting a plane reference beam into a spherical reference beam so that the reconstructing reference beam corresponds to the spherical reference beam.

10. The angular multiplexing apparatus of claim 9, wherein the converting unit is a lens.

11. The angular multiplexing apparatus of claim 10, wherein a total path of the spherical reference beam and the reflected beam from the lens to the reconstructing position is substantially equivalent to a focal length of the lens.

12. The angular multiplexing apparatus of claim 11, wherein a perpendicular distance x from the reconstructing position to the spherical reference beam, a distance y from an intersecting point between a line passing though the reconstructing position and the spherical reference beam to a reflecting point of the plane of reflection in the mirror array from which the reflected beam corresponding to the spherical reference beam is generated, and an inclination angle $\phi$ of the plane of reflection to the line are calculated as:

$$y + r = c, \qquad y > 0, r > 0, c > 0,$$

$$x = r\cos\theta = \frac{c\cos\theta}{1 + \sin\theta}, \quad y = r\sin\theta = \frac{c\sin\theta}{1 + \sin\theta},$$

$$\varphi = \frac{\frac{\pi}{2} - \theta}{2}$$

wherein $\theta$ is the incidence angle of the reflected beam onto the reconstructing position and a constant c is a sum of a distance from the intersecting point to the reflecting point and a distance from the reflecting point and the reconstructing position.

13. The angular multiplexing apparatus of claim 12, wherein the constant c is the focal length of the lens when the lens is located at the intersecting point.

* * * * *